United States Patent
Chen et al.

(10) Patent No.: US 8,450,928 B2
(45) Date of Patent: May 28, 2013

(54) ORGANIC LIGHT EMITTING DISPLAY DEVICE AND METHOD OF MANUFACTURING THE SAME

(75) Inventors: Hong Chen, Yongin (KR); Jung-Mi Choi, Yongin (KR); Hoon Kim, Yongin (KR); Kie-Hyun Nam, Yongin (KR); Mu-Hyun Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 4 days.

(21) Appl. No.: 13/047,195

(22) Filed: Mar. 14, 2011

(65) Prior Publication Data

US 2011/0273077 A1    Nov. 10, 2011

(30) Foreign Application Priority Data

May 4, 2010   (KR) .......................... 10-2010-0042066

(51) Int. Cl.
*H01L 51/00*    (2006.01)
*H05B 33/04*    (2006.01)

(52) U.S. Cl.
USPC .......................................... 313/512; 313/504

(58) Field of Classification Search
USPC ...................... 313/512, 504; 257/99
See application file for complete search history.

(56) References Cited

U.S. PATENT DOCUMENTS

| | | | |
|---|---|---|---|
| 6,998,648 B2 * | 2/2006 | Silvernail | 257/99 |
| 7,202,602 B2 * | 4/2007 | Anandan | 313/512 |
| 7,948,178 B2 * | 5/2011 | Cok | 313/512 |
| 2006/0258172 A1 * | 11/2006 | Russell et al. | 438/778 |
| 2008/0238302 A1 | 10/2008 | Sung et al. | |
| 2008/0254314 A1 * | 10/2008 | Russell et al. | 428/640 |

FOREIGN PATENT DOCUMENTS

| | | |
|---|---|---|
| JP | 2002277859 | 9/2002 |
| JP | 2003303680 | 10/2003 |
| JP | 2003532260 | 10/2003 |
| JP | 2008166739 | 7/2008 |
| KR | 20020065125 A | 8/2002 |
| KR | 20030042169 A | 5/2003 |
| KR | 20050048133 A | 5/2005 |
| KR | 20080065210 A | 7/2008 |
| KR | 20080088031 A | 10/2008 |
| KR | 20090059606 A | 6/2009 |
| WO | 0182389 | 11/2001 |

OTHER PUBLICATIONS

Korean Notice of Allowance issued on Feb. 29, 2012 in connection with Korean Patent Application Serial No. 10-2010-0042066 and Request for Entry of the Accompanying Office Action attached herewith.

\* cited by examiner

*Primary Examiner* — Karabi Guharay
(74) *Attorney, Agent, or Firm* — Robert E. Bushnell, Esq.

(57) ABSTRACT

Provided is an organic light emitting device, which is flexible and is capable of effectively preventing permeation of oxygen or moisture. The organic light emitting device includes a substrate; a metal sheet that faces the substrate; an organic light emitting unit that is interposed between the substrate and the metal sheet; an adhesive unit that is interposed between the substrate and the metal sheet to adhere the substrate and the metal sheet to each other and that is located around at least the organic light emitting unit; and an adhesive layer that is formed at a location on the metal sheet where the metal sheet contacts the adhesive unit and that is formed of a metal oxide or a metal nitride.

15 Claims, 2 Drawing Sheets

ORGANIC LIGHT EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application for ORGANIC LIGHT EMITTING DISPLAY AND METHOD OF MANUFACTURING THE SAME earlier filed in the Korean Intellectual Property Office on 4 May 2010 and there duly assigned Korean Patent Application No. 10-2010-0042066.

BACKGROUND OF THE INVENTION

1. Field of the Invention

Aspects of the present invention relate to an organic light emitting display device and a method of manufacturing the same, and more particularly, to an organic light emitting display device including a metal film and a method of manufacturing the organic light emitting display device.

2. Description of the Related Art

Organic light emitting display devices generally have wide viewing angles, high contrast ratios, short response times, and reduced power consumption. Thus, the organic light emitting display may be used across a variety of applications such as personal portable devices (e.g., MP3 players and mobile phones) or large screen displays (e.g., television sets).

Performance of an organic light emitting display device may deteriorate due to permeation of oxygen or moisture. Therefore, an organic light emitting display device requires a sealing structure for blocking permeation of oxygen and moisture. Furthermore, since such a sealing structure affects the flexibility of an organic light emitting display device, it is necessary to form the sealing structure by using a flexible material.

SUMMARY OF THE INVENTION

Aspects of the present invention provide an organic light emitting device, which is flexible and is capable of effectively preventing permeation of oxygen or moisture.

According to an aspect of the present invention, there is provided an organic light emitting display device including a substrate; a metal sheet that faces the substrate; an organic light emitting unit that is interposed between the substrate and the metal sheet; an adhesive unit that is interposed between the substrate and the metal sheet to adhere the substrate and the metal sheet to each other and that is located around at least the organic light emitting unit; and an adhesive layer that is formed at a location on the metal sheet where the metal sheet contacts the adhesive unit and that is formed of a metal oxide or a metal nitride.

According to an aspect of the invention, the adhesive layer may be formed of a metal constituting the metal sheet and oxygen or nitrogen.

According to an aspect of the invention, the metal sheet may be formed of aluminum, stainless steel, invar, magnesium, or an alloy thereof.

According to an aspect of the invention, the adhesive unit may be formed of an epoxy-based adhesive, a silicon-based adhesive, or an acryl-based adhesive.

According to an aspect of the invention, the substrate may be formed of a glass.

According to another aspect of the present invention, there is provided a method of manufacturing an organic light emitting display device, the method including forming an organic light emitting unit on a substrate; preparing a metal sheet; forming an adhesive layer by performing plasma processing on at least a portion of a first surface of the metal sheet; forming an adhesive unit on the adhesive layer; arranging the first surface of the metal sheet to face the organic light emitting unit of the substrate, in such a way that the adhesive unit contacts the substrate; and hardening the adhesive unit.

According to an aspect of the invention, the plasma processing may be performed on the first surface of the metal sheet by using $O_2$ plasma, $N_2$ plasma, Ar plasma, or H2 plasma.

According to an aspect of the invention, the plasma processing may be performed after a mask including an opening that corresponds to a region in which the adhesive layer is to be formed, is arranged on the first surface of the metal sheet.

According to an aspect of the invention, the metal sheet may be formed of aluminum, stainless steel, invar, magnesium, or an alloy thereof.

According to an aspect of the invention, the adhesive unit may be formed of an epoxy-based adhesive, a silicon-based adhesive, or an acryl-based adhesive.

According to an aspect of the invention, the substrate may be formed of a glass.

According to an aspect of the invention, the method may further include forming a peeling layer on a second surface of the metal sheet; forming a supporting unit on the peeling layer; and hardening the adhesive unit and removing the supporting unit from the metal sheet by peeling the peeling layer.

Additional aspects and/or advantages of the invention will be set forth in part in the description which follows and, in part, will be obvious from the description, or may be learned by practice of the invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
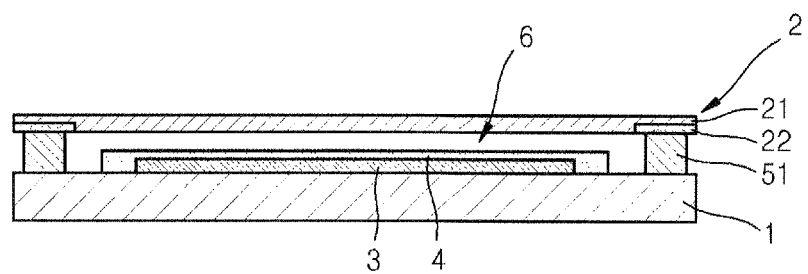
FIG. 1 is a sectional view of an organic light emitting display device according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a sectional view of an organic light emitting display device according to an embodiment of the present invention. As shown in FIG. 1, an organic light emitting unit 3 is formed on a surface of a substrate 1. The substrate 1 may be a glass substrate. However, the present invention is not limited thereto, and the substrate 1 may also be a plastic substrate. However, a glass substrate may be used when a high temperature process for fabricating thin-film transistors of pixel circuits of the organic light emitting unit 3 is to be performed.

The organic light emitting unit 3 may include an organic light emitting device including an anode electrode, an organic thin-film layer, and a cathode electrode, and may further include a thin-film transistor for controlling operations of the organic light emitting device and a capacitor for storing signals. However, the invention is not limited thereto. For instance, the organic light emitting device can be otherwise constructed. Moreover, while described in terms of organic light emitting device, it is understood that aspects of the invention can be used with other types of light emitting units, such as where a non-organic light emitting unit can be used instead of the organic light emitting unit 3.

While not required in all aspects, a passivation film 4 is formed to cover the organic light emitting unit 3. The passivation film 4 may be formed as a single layer or a multi layer of silicon nitride, silicon oxide, aluminum oxide, an organic material, or a combination thereof. Examples of combinations may include a stack of silicon nitride and silicon oxide, a stack of silicon nitride and aluminum oxide, and a stack of silicon nitride and an organic material. The passivation film 4 may be formed to have a thickness between about 0.2 μm to about 5 μm. However, the present invention is not limited thereto, and any of various materials may be applied as a single layer or as a plurality of layers in other thicknesses.

A metal sheet 2 is arranged to face the substrate 1 on which the organic light emitting unit 3 and the passivation film 4 are formed. While not required in all aspects, the metal sheet 2 may be formed of aluminum, stainless steel, invar, magnesium, or an alloy thereof. While not required in all aspects, the metal sheet 2 may be formed to have a thickness between about 10 μm to about 10 mm, so that the metal sheet 2 simultaneously has sufficient hardness and sufficient flexibility. The metal sheet 2 includes a sheet body 21 and an adhesive layer 22, which will be described in detailed later.

The metal sheet 2 is adhered to the substrate 1 via a sealing member 51. The sealing member 51 forms a closed-loop to surround the organic light emitting unit 3 and the passivation film 4. Although FIG. 1 shows that the sealing member 51 forms a single closed-loop only at edges of the substrate 1, the configuration corresponds to a case of forming one organic light emitting display device by using one substrate 1. Therefore, when forming a plurality of organic light emitting display devices by using one substrate 1, a plurality of closed-loops as described above may be formed. Furthermore, the sealing member 51 may be additionally arranged to form double closed loops or triple closed loops.

While not required in all aspects, the sealing member 51 may be formed of an epoxy-based adhesive, a silicon-based adhesive, an acrylic adhesive, or the like, and may be formed to have a thickness between about 5 μm to about 500 μm. Furthermore, since light may not transmit through the metal sheet 2 in aspects of the invention, the sealing member 51 may be formed of a thermal hardening adhesive. However, if it is possible to irradiate light from below the substrate 1, an ultraviolet (UV) ray hardening adhesive may be used in other aspects.

A space 6 is formed between the substrate 1 and the metal sheet 2, which are adhered to each other and sealed by the sealing member 51. While shown as empty, the space 6 may be filled with a filler. The filler may be formed of a colorless liquid material or a colorless gel-like material that exhibits transmittance above 95% at a thickness under 30 μm. Examples of gel-like materials may include an epoxy, urethane acrylate, epoxy acrylate, or a silicon-based resin (e.g., bisphenol A type epoxy, cycloaliphatic epoxy resin, phenyl silicon resin or rubber, acrylic epoxy resin, aliphatic urethane acrylate, or the like). The filler as a gel-like material may fill the space 6 as a liquid and is hardened by irradiating an electron beam or a UV ray thereto. Alternatively, the filler as a gel-like material may be molded into a film and attached to the passivation layer 4. Furthermore, examples of liquid materials may include a silicon material, e.g., a silicon oil, that exhibits no change of phase and a volume variation below 5% within about −40° C. to about 100° C. (e.g., a material selected from the group consisting of hexamethyldisiloxane, octamethyltrisiloxane, decamethyltetrasiloxane, dodecamethylpentasiloxane, and polymethylsiloxanes). Also, a moisture absorbing material may be added to the filler. Examples of the moisture absorbing material include, but are not limited to, CaO, BaO, a zeolite-based or aluminum-based organometallic complex, a moisture absorbing polymer such as a polyacryrilic acid, or the like.

As shown in FIG. 1, the metal sheet 2 includes the sheet body 21 and the adhesive layer 22. The sheet body 21 corresponds to a portion of the metal sheet 2 that is formed of a metal, whereas the adhesive layer 22 is formed at least on a portion of the metal sheet 2 contacting the sealing member 51.

The adhesive layer 22 is formed of a metal oxide or a metal nitride. At this point, the metal oxide or the metal nitride constituting the adhesive layer 22 may be a compound of the metal constituting the sheet body 21 of the metal sheet 2 and oxygen or nitride. For example, in the case where the sheet body 21 of the metal sheet 2 is formed of aluminum, the adhesive layer 22 may be formed of aluminum oxide or aluminum nitride.

The adhesive layer 22 improves adhesiveness between the metal sheet 2 and the sealing member 51. The adhesiveness between the metal sheet 2 and the sealing member 51 decreases due to the metal sheet 2 and the sealing member 51 having different thermal expansion ratios. Therefore, if an organic light emitting display device is used for an extended period of time, moisture or oxygen may permeate from an interface between the metal sheet 2 and the sealing member 51. According to aspects of the present invention, the metal sheet 2 may be firmly attached to the sealing member 51 by forming the adhesive layer 22.

Figure 2:
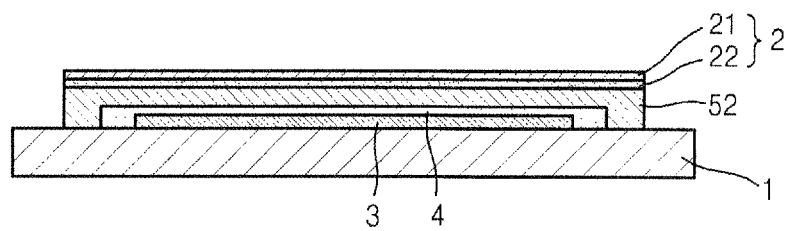
FIG. 2 is a sectional view of an organic light emitting display device according to another embodiment of the present invention.

FIG. 2 is a sectional view of an organic light emitting display device according to another embodiment of the present invention. A sealing layer 52 is formed on the substrate 1 to completely cover the passivation film 4. The sealing layer 52 may be formed of an epoxy-based adhesive, a silicon-based adhesive, an acrylic adhesive, or the like, wherein the sealing layer 52 may be formed to have a thickness between about 5 μm to about 500 μm. The sealing layer 52 may be formed of a thermal hardening adhesive. Furthermore, the sealing layer 52 may be formed of a thermal sheet.

Since the sealing layer 52 is formed on the substrate 1 to completely cover the passivation film 4 as described above, the adhesive layer 22 may be formed on an entire surface of the metal sheet 2. In this case, the adhesiveness between the metal sheet 2 and the sealing layer 52 may be significantly improved due to the adhesive layer 22.

The adhesive layer 22 may be formed to have a thickness between about 0.1 μm to about 10 μm. If the thickness of the adhesive layer 22 is smaller than 0.1 μm, it is difficult to expect improved adhesiveness due to the adhesive layer 22. In contrast, if the thickness of the adhesive layer 22 exceeds 10 μm, excessive time and energy are consumed for formation of the adhesive layer 22, and thus productivity decreases. Furthermore, in this case, moisture or oxygen may permeate through the adhesive layer 22.

Figure 3:
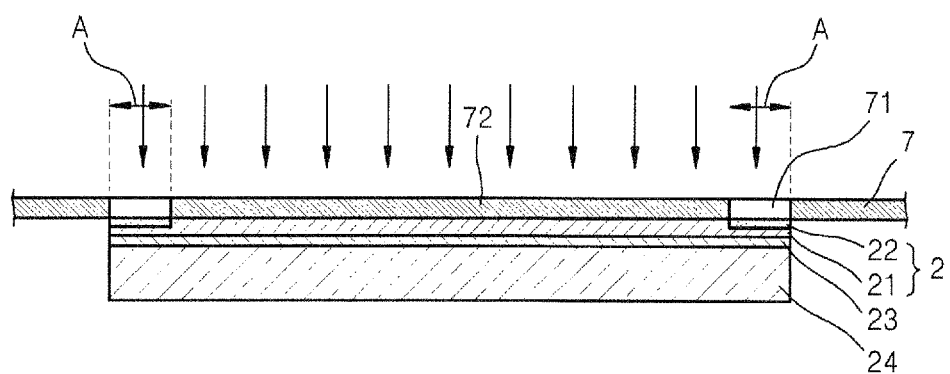
FIGS. 3 through 5 are sectional views sequentially showing a method of manufacturing the organic light emitting display device of FIG. 1.

Next, referring to FIGS. 3 through 5, a method of manufacturing the organic light emitting display device of FIG. 1 according to an embodiment of the present invention will be described. As shown in FIG. 3, a peeling layer 23 is formed on a rear surface of the metal sheet 2. A supporting body 24 is formed on the peeling layer 23, so that the metal sheet 2 may be handled easily. The supporting body 24 and the metal sheet 2 may be separated from each other by irradiating a laser or a UV ray onto the peeling layer 23 or by heating the peeling layer 23.

A mask 7 is disposed on the metal sheet 2. The mask 7 has a shield portion 72 and an opening 71 that corresponds to an area A in which the adhesive layer 22 is to be formed.

While the mask 7 is disposed on a top surface of the metal sheet 2, plasma processing is performed from above the mask 7. A plasma used for the plasma processing may be $O_2$ plasma, $N_2$ plasma, Ar plasma, or H2 plasma. Then, the adhesive layer 22 is formed on the sheet body 21 of the metal sheet 2 by performing the plasma processing via the opening 71. In other words, the adhesive layer 22 is an oxide or a nitride of the metal constituting the metal sheet 2, which is formed by performing plasma processing on a portion of the sheet body 21 of the metal sheet 2. While described in terms of processing using plasma processing to produce the adhesive layer 22, it is understood that other mechanisms can be used to create the adhesive layer 22. Moreover, it is understood that the metal in the adhesive layer 22 need not be the same as the metal in the sheet body 21 in all aspects.

Figure 4:
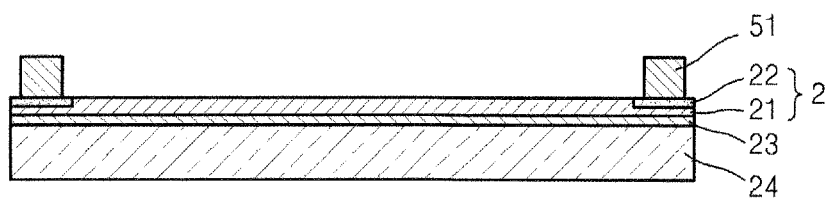
Figure 5:
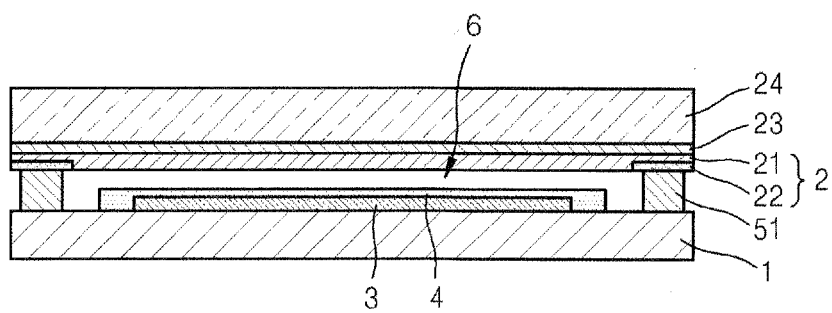

As shown in FIG. 4, the sealing member 51 is applied on the adhesive layer 22. Then, the metal sheet 2, on which the sealing member 51 is applied and on which the supporting unit 24 is attached, is arranged on the substrate 1, on which the organic light emitting unit 3 and the passivation film 4 are formed. At this point, the sealing member 51 may become a closed-loop surrounding the organic light emitting unit 3 and the passivation film 4.

Next, the sealing member 51 is hardened and the supporting unit 24 is removed from the metal sheet 2 by peeling the peeling layer 23.

The structure according to the embodiment shown in FIG. 2 may be formed by not using the mask and performing plasma processing on an entire surface of the metal sheet 2.

As described above, according to aspects of the present invention, permeation of moisture or oxygen into an organic light emitting display device may be blocked by simply forming a metal oxide or a metal nitride at a location where a metal sheet contacts a sealing member by performing plasma processing on the metal sheet.

According to embodiments of the present invention as described above, an organic light emitting display device with shock-resistance and flexibility due to a metal sheet may be provided.

Furthermore, adhesiveness between a sealing member and a metal sheet may be improved by interposing an adhesive layer formed of a metal oxide or a metal nitride therebetween, and thus permeation of oxygen and moisture may be blocked.

While described in terms of being used in an organic light emitting display device, it is understood that aspects can by used in other flexible and rigid display devices, such as field emission displays, LCDs, and PDPs.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting display device, comprising:
   a substrate;
   a metal sheet that faces the substrate and comprises a metal;
   an organic light emitting unit that is interposed between the substrate and the metal sheet;
   an adhesive unit that is interposed between the substrate and the metal sheet and adheres the substrate to the metal sheet, the adhesive unit being located around at least the organic light emitting unit; and
   an adhesive layer that is formed at a location on the metal sheet where the metal sheet contacts the adhesive unit and comprises an oxide or nitride of the metal constituting the metal sheet.

2. The organic light emitting display device of claim 1, wherein the metal sheet comprises aluminum, stainless steel, invar, magnesium, or an alloy thereof.

3. The organic light emitting display device of claim 1, wherein the adhesive unit comprises an epoxy-based adhesive, a silicon-based adhesive, or an acryl-based adhesive.

4. The organic light emitting display device of claim 1, wherein the substrate comprises a glass.

5. A method of manufacturing an organic light emitting display device, the method comprising:
   forming an organic light emitting unit on a substrate;
   preparing a metal sheet which comprises a metal;
   forming an adhesive layer by performing plasma processing on at least a portion of a first surface of the metal sheet, with the adhesive layer comprising an oxide or nitride of the metal constituting the metal sheet;
   forming an adhesive unit on the adhesive layer;
   arranging the first surface of the metal sheet to face the organic light emitting unit of the substrate, in such a way that the adhesive unit contacts the substrate; and
   hardening the adhesive unit.

6. The method of claim 5, wherein the plasma processing is performed on the first surface of the metal sheet by using $O_2$ plasma, $N_2$ plasma, Ar plasma, or H2 plasma.

7. The method of claim 5, wherein the plasma processing is performed after a mask comprising an opening that corresponds to a region in which the adhesive layer is to be formed, is arranged on the first surface of he metal sheet.

8. The method of claim 5, wherein the metal sheet is formed of aluminum, stainless steel, invar, magnesium, or an alloy thereof.

9. The method of claim 5, wherein the adhesive unit is formed of an epoxy-based adhesive, a silicon-based adhesive, or an acryl-based adhesive.

10. The method of claim 5, wherein the substrate is formed of a glass.

11. The method of claim 5, further comprising:
    forming a peeling layer on a second surface of the metal sheet;
    forming a supporting unit on the peeling layer; and
    hardening the adhesive unit and removing the supporting unit from the metal sheet by peeling the peeling layer.

12. A method of manufacturing a display device, the method comprising:
    forming an adhesive layer comprising a nitride or an oxide of a metal of a metal sheet; and
    adhering a substrate having a light emitting unit to the metal sheet using an adhesive unit adhered to the formed adhesive layer such that the light emitting unit is disposed in a space formed between the metal sheet, the adhesive unit, and the substrate.

13. The method of claim 12, wherein the forming the adhesive layer comprises plasma processing a surface of the metal sheet by using $O_2$ plasma, $N_2$ plasma, Ar plasma, or H2 plasma.

14. The method of claim 13, wherein the plasma processing comprising plasma processing using a mask comprising an opening that corresponds to a region of the surface on which the adhesive layer is to be formed so as to form the adhesive layer on one portion of the surface and not on another portion of the surface.

15. The method of claim 13, wherein the plasma processing comprises plasma processing all of the surface so as to form a continuous adhesive layer on the surface.

* * * * *